(12) United States Patent
Yuan et al.

(10) Patent No.: US 12,376,457 B2
(45) Date of Patent: Jul. 29, 2025

(54) DISPLAY SUBSTRATE AND METHOD FOR MANUFACTURING THE SAME, AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN); Meng Li, Beijing (CN); Xuelian Cheng, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 751 days.

(21) Appl. No.: 17/614,301

(22) PCT Filed: Nov. 6, 2020

(86) PCT No.: PCT/CN2020/127235
§ 371 (c)(1),
(2) Date: Nov. 24, 2021

(87) PCT Pub. No.: WO2021/093687
PCT Pub. Date: May 20, 2021

(65) Prior Publication Data
US 2022/0262886 A1 Aug. 18, 2022

(30) Foreign Application Priority Data
Nov. 13, 2019 (CN) .......................... 201911108797.6

(51) Int. Cl.
*H10K 59/121* (2023.01)
*H10K 59/12* (2023.01)
*H10K 59/131* (2023.01)

(52) U.S. Cl.
CPC ..... *H10K 59/1216* (2023.02); *H10K 59/1213* (2023.02); *H10K 59/131* (2023.02); *H10K 59/1201* (2023.02)

(58) Field of Classification Search
CPC .... H10K 59/1201; H10K 71/00; H10K 50/81; H10K 50/828; H01L 28/60; H01L 27/1255; G02F 1/133514; G02F 2001/133521
See application file for complete search history.

(56) References Cited

U.S. PATENT DOCUMENTS

2011/0309362 A1 12/2011 Yoon et al.
2015/0187854 A1 7/2015 Beak et al.
(Continued)

FOREIGN PATENT DOCUMENTS

CN 101295721 A 10/2008
CN 102290421 A 12/2011
(Continued)

OTHER PUBLICATIONS

Bottom Emission OLED Struc OM Emission OLED Structure to Enhance out Ance Outcoupling Efficiency (Year: 2019).*
(Continued)

*Primary Examiner* — Britt D Hanley
*Assistant Examiner* — William C. Trice, III
(74) *Attorney, Agent, or Firm* — XSENSUS LLP

(57) ABSTRACT

A display substrate, a method for manufacturing the same, and a display apparatus are provided. The display substrate includes a base, and a pixel driving circuit and a bottom-emission light-emitting device that are arranged on the base
(Continued)

and located in each sub-pixel in a display area. The light-emitting device includes a first electrode connected to the pixel driving circuit. The pixel driving circuit includes a first storage capacitor, the first storage capacitor includes a first storage electrode and a second storage electrode that are opposite to each other. The first electrode further serves as the first storage electrode, and the second storage electrode and the first electrode are both transparent electrodes.

18 Claims, 13 Drawing Sheets

(56) References Cited

U.S. PATENT DOCUMENTS

| | | | |
|---|---|---|---|
| 2015/0214249 | A1 | 7/2015 | Cheng et al. |
| 2016/0254337 | A1 | 9/2016 | Choi et al. |
| 2017/0186826 | A1* | 6/2017 | Nam .................. H10K 59/126 |
| 2018/0033847 | A1* | 2/2018 | Kim .................. H10K 59/122 |
| 2019/0131369 | A1* | 5/2019 | Choi .................. H10K 59/131 |

FOREIGN PATENT DOCUMENTS

| | | |
|---|---|---|
| CN | 103208506 A | 7/2013 |
| CN | 104752637 A | 7/2015 |
| CN | 107403804 A | 11/2017 |
| CN | 110047892 A | 7/2019 |
| CN | 110783490 A | 2/2020 |

OTHER PUBLICATIONS

The First Office Action of Priority Application No. CN 201911108797.6 issued by the Chinese Patent Office on Mar. 26, 2021.
The Second Office Action of Priority Application No. CN 201911108797.6 issued by the Chinese Patent Office on Sep. 13, 2021.
Decision of Rejection of Priority Application No. CN 201911108797.6 issued by the Chinese Patent Office on April 7, 2022.

* cited by examiner

DISPLAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/127235 filed on Nov. 6, 2020, which claims priority to Chinese Patent Application No. 201911108797.6, filed on Nov. 13, 2019, titled "DISPLAY PANEL AND METHOD FOR MANUFACTURING THE SAME", which are incorporated herein by reference in their entirety.

TECHNICAL FIELD

The present disclosure relates to the field of display technologies, and in particular, to a display substrate and a method for manufacturing the same, and a display apparatus.

BACKGROUND

Self-luminescent display substrates such as organic light-emitting diode (OLED) display substrates have advantages of self-luminescence, lightness and thinness, low power consumption, good color reproduction, sensitive response, wide viewing angle and the like. They have been more and more widely used in display apparatuses such as mobile phones, notebook computers and televisions, and have become one of mainstreams in the current market.

SUMMARY

In an aspect, some embodiments of the present disclosure provide a display substrate. The display substrate has a display area provided with a plurality of sub-pixels, the display substrate includes a base, and a pixel driving circuit and a bottom-emission light-emitting device that are disposed on the base and located in each sub-pixel in the display area. The light-emitting device includes a first electrode electrically connected to the pixel driving circuit. The pixel driving circuit includes a first storage capacitor, and the first storage capacitor includes a first storage electrode and a second storage electrode that are disposed opposite to each other. The first electrode further serves as the first storage electrode. Both the second storage electrode and the first electrode are transparent electrodes.

In some embodiments, the display substrate further includes power lines. The pixel driving circuit further includes a first transistor. The first transistor includes a first gate, a first semiconductor active pattern, a first source and a first drain. The first transistor is a driving transistor. The first source is electrically connected to a power line, and the first drain is electrically connected to the first electrode. The first semiconductor active pattern includes a first channel portion, a first source portion and a first drain portion. Conductivities of the first source portion and the first drain portion are greater than a conductivity of the first channel portion. The first source is in contact with the first source portion, and the first drain is in contact with the first drain portion. The second storage electrode is an electrode obtained by performing a conducting processing on a semiconductor pattern. The second storage electrode is disposed in a same layer and made of a same material as the first source portion and the first drain portion.

In some embodiments, the display substrate further includes gate lines and data lines. The pixel driving circuit further includes a second transistor, and the second transistor includes a second gate, a second semiconductor active pattern, a second source and a second drain. A portion of a gate line serves as the second gate. The second source is electrically connected to a data line. The second drain is electrically connected to the second storage electrode and the first gate.

In some embodiments, the display substrate further includes first connection electrodes. A first connection electrode and the second drain are of an integrated structure, and the first connection electrode is electrically connected to the second storage electrode and the first gate through a first via hole.

The second drain and the first gate have a gap therebetween in a first direction. The first gate extends in a second direction. The first direction and the second direction are perpendicular or substantially perpendicular. The first connection electrode extends in the first direction. The first connection electrode includes a first connection portion and a second connection portion. The first connection portion is a portion, an orthogonal projection of which on the base overlaps with an orthogonal projection of the first gate on the base, of the first connection electrode. The second connection portion is a portion, which is located at a side of the first connection portion proximate to the second drain, of the first connection electrode. A dimension of the first connection portion in the second direction is larger than a dimension of the second connection portion in the second direction.

In some embodiments, the second semiconductor active pattern includes a second channel portion, a second source portion, and a second drain portion. The second source is in contact with the second source portion, and the second drain is in contact with the second drain portion. The second storage electrode and the second drain portion are of an integrated structure. The second storage electrode is electrically connected to the first gate through a second via hole.

The second drain and the first gate have a gap therebetween in a first direction. The first gate extends in a second direction. The first direction and the second direction are perpendicular or substantially perpendicular. The second storage electrode includes an extension portion that extends in the first direction and is electrically connected to the second drain portion. The extension portion includes a first extension sub-portion and a second extension sub-portion. The first extension sub-portion is a portion, an orthogonal projection of which on the base overlaps with an orthogonal projection of the first gate on the base, of the extension portion. The second extension sub-portion is a portion, which is located at a side of the first extension sub-portion proximate to the second drain portion, of the extension portion. A dimension of the first extension sub-portion in the second direction is larger than a dimension of the second extension sub-portion in the second direction.

In some embodiments, in a case where the pixel driving circuit includes the second transistor, the pixel driving circuit further includes a third transistor. The third transistor includes a third gate, a third semiconductor active pattern, a third source and a third drain. The first transistor and the third transistor are located on both sides of the first storage capacitor in a first direction, the first direction is a direction in which the power lines extend. The display substrate further includes second connection electrodes and sensing signal lines. The third source is electrically connected to the first drain through a second connection electrode, and the third source, the second connection electrode and the first drain are of an integrated structure. The third drain is electrically connected to a sensing signal line. The second connection electrode is electrically connected to the first electrode through a third via hole.

In some embodiments, for third gates of third transistors in any row of sub-pixels, portions of the gate line connected to second transistors in an adjacent row of sub-pixels closest to the third transistors in the row of sub-pixels serve as the third gates of the third transistors.

Based on this, the first transistor is a top-gate thin film transistor.

The display substrate further includes first metal patterns each disposed on a side of the first semiconductor active pattern proximate to the base. In a thickness direction of the base, an orthogonal projection of the first semiconductor active pattern on the base is within an orthogonal projection of a first metal pattern on the base.

The display substrate further includes second metal patterns. In the thickness direction of the base, an orthogonal projection of a second metal pattern on the base and an orthogonal projection of the second connection electrode on the base at least partially overlap.

The first metal pattern and the second metal pattern in the sub-pixel are of an integrated structure. The second metal pattern is electrically connected to the second connection electrode through a fourth via hole. The pixel driving circuit further includes a second storage capacitor. The second storage capacitor is composed of at least a part of the second storage electrode and at least a part of the second metal pattern.

The first transistor, the second transistor and the third transistor are all top-gate thin film transistors.

In a case where the display substrate further includes data lines, the power lines, the sensing signal lines and the data lines are arranged in parallel and in a same layer.

In each row of sub-pixels, every two adjacent sub-pixels are as a group, and two data lines are disposed between the two sub-pixels in each group. A position at a side of each group of sub-pixels is provided with one power line, and a position at an opposite side of the group of sub-pixels is provided with one sensing signal line, and the power lines and the sensing signal lines are arranged alternately.

For each row of sub-pixels, pixel driving circuits in two sub-pixels that are located at a side of the power line and proximate to the power line and pixel driving circuits in two sub-pixels that are located at another side of the power line and proximate to the power line are all connected to the power line.

For each row of sub-pixels, pixel driving circuits in two sub-pixels that are located at a side of the sensing signal line and proximate to the sensing signal line and pixel driving circuits in two sub-pixels that are located at another side of the sensing signal line and proximate to the sensing signal line are all connected to the sensing signal line.

Based on this, the display substrate further includes: a first auxiliary electrode corresponding to any power line, and a second auxiliary electrode corresponding to any sensing signal line.

In the thickness direction of the base, an orthogonal projection of the first auxiliary electrode on the base is within an orthogonal projection of the power line on the base. The first auxiliary electrode is electrically connected to the power line through a plurality of fifth via holes.

In the thickness direction of the base, an orthogonal projection of the second auxiliary electrode on the base is within an orthogonal projection of the sensing signal line on the base. The second auxiliary electrode is electrically connected to the sensing signal line through a plurality of sixth via holes.

The first auxiliary electrode and the second auxiliary electrode are disposed in a same layer and made of a same material as the first gate.

In some embodiments, the first electrode includes a first sub-electrode and a second sub-electrode that are disposed opposite to each other and electrically connected, and the second sub-electrode is disposed on a side of the first sub-electrode away from the base. The display substrate further includes filter units and a planarization layer that are stacked between the first sub-electrode and the second sub-electrode. The planarization layer is located on a side of the filter units proximate to the second sub-electrode.

In another aspect, some embodiments of the present disclosure provide a display apparatus. The display apparatus includes the display substrate according to any one of the above embodiments.

In yet another aspect, some embodiments of the present disclosure provide a method for manufacturing a display substrate. The method includes:

forming a pixel driving circuit in each sub-pixel in a display area on a base, the pixel driving circuit including a first storage capacitor, the first storage capacitor including a first storage electrode and a second storage electrode that are opposite to each other, both the first storage electrode and the second storage electrode being transparent electrodes; and forming a bottom-emission light-emitting device in the sub-pixel on the base, the bottom-emission light-emitting device being located on a side of the pixel driving circuit away from the base; the light-emitting device including a first electrode, and the first storage electrode serving as the first electrode.

In some embodiments, the pixel driving circuit further includes a first transistor, and the first transistor includes a first gate, a first semiconductor active pattern, a first source and a first drain. The first transistor is a driving transistor.

Forming the pixel driving circuit further includes: synchronously forming a semiconductor pattern used for forming the second storage electrode in a process of forming the first semiconductor active pattern; and performing a conducting processing on the semiconductor pattern used for forming the second storage electrode to obtain the second storage electrode.

In some embodiments, the display substrate further includes gate lines and data lines. The pixel driving circuit further includes a second transistor, and the second transistor includes a second gate, a second semiconductor active pattern, a second source and a second drain. Forming the pixel driving circuit further includes: synchronously forming the second semiconductor active pattern in a process of forming the first semiconductor active pattern.

A portion of a gate line serves as the second gate. Correspondingly, the method for manufacturing the display substrate further includes: synchronously forming the gate lines in a process of forming the first gate.

The second source is electrically connected to a data line, and the second drain is electrically connected to the first gate and the second storage electrode. Correspondingly, the method for manufacturing the display substrate further includes: synchronously forming the second source, the second drain, and the data lines in a process of forming the first source and the first drain.

In some embodiments, the display substrate further includes power lines and sensing signal lines. The first source is electrically connected to a power line, and the first drain is electrically connected to the first electrode. The pixel driving circuit further includes a third transistor, and the third transistor includes a third gate, a third semiconductor active pattern, a third source and a third drain. The third source is electrically connected to the first drain through a second connection electrode, and the third source, the second connection electrode and the first drain are of an integrated structure. The third drain is electrically connected to a sensing signal line. For third gates of third transistors in any row of sub-pixels, portions of the gate line connected to second transistors in an adjacent row of sub-pixels closest to the third transistors in the row of sub-pixels serve as the third gates of the third transistors. Forming the pixel driving circuit further includes: synchronously forming the third semiconductor active pattern in a process of forming the first semiconductor active pattern.

The method for manufacturing the display substrate further includes: synchronously forming the third source, the third drain, the power lines and the sensing signal lines in a process of forming the data lines.

The method for manufacturing the display substrate further includes: synchronously forming a first metal pattern and a second metal pattern in the sub-pixel on the base before the pixel driving circuit is formed, so that after the pixel driving circuit is formed, the first semiconductor active pattern is formed on a side of the first metal pattern away from the base, and the second connection electrode is formed on a side of the second metal pattern away from the base. In a thickness direction of the base, an orthogonal projection of the first semiconductor active pattern on the base is within an orthogonal projection of the first metal pattern on the base, and an orthogonal projection of the second metal pattern on the base and an orthogonal projection of the second connection electrode on the base at least partially overlap; the first metal pattern and the second metal pattern in the sub-pixel are of an integrated structure, the second metal pattern is electrically connected to the second connection electrode through a fourth via hole; and the second metal pattern is electrically connected to the third source.

BRIEF DESCRIPTION OF THE DRAWINGS

In order to describe technical solutions in embodiments of the present disclosure more clearly, accompanying drawings to be used in the description of the embodiments will be introduced briefly. Obviously, the accompanying drawings to be described below are merely accompanying drawings of some embodiments of the present disclosure, and a person of ordinary skill in the art may obtain other drawings according to these drawings without paying any creative effort.

DETAILED DESCRIPTION

Figure 1:
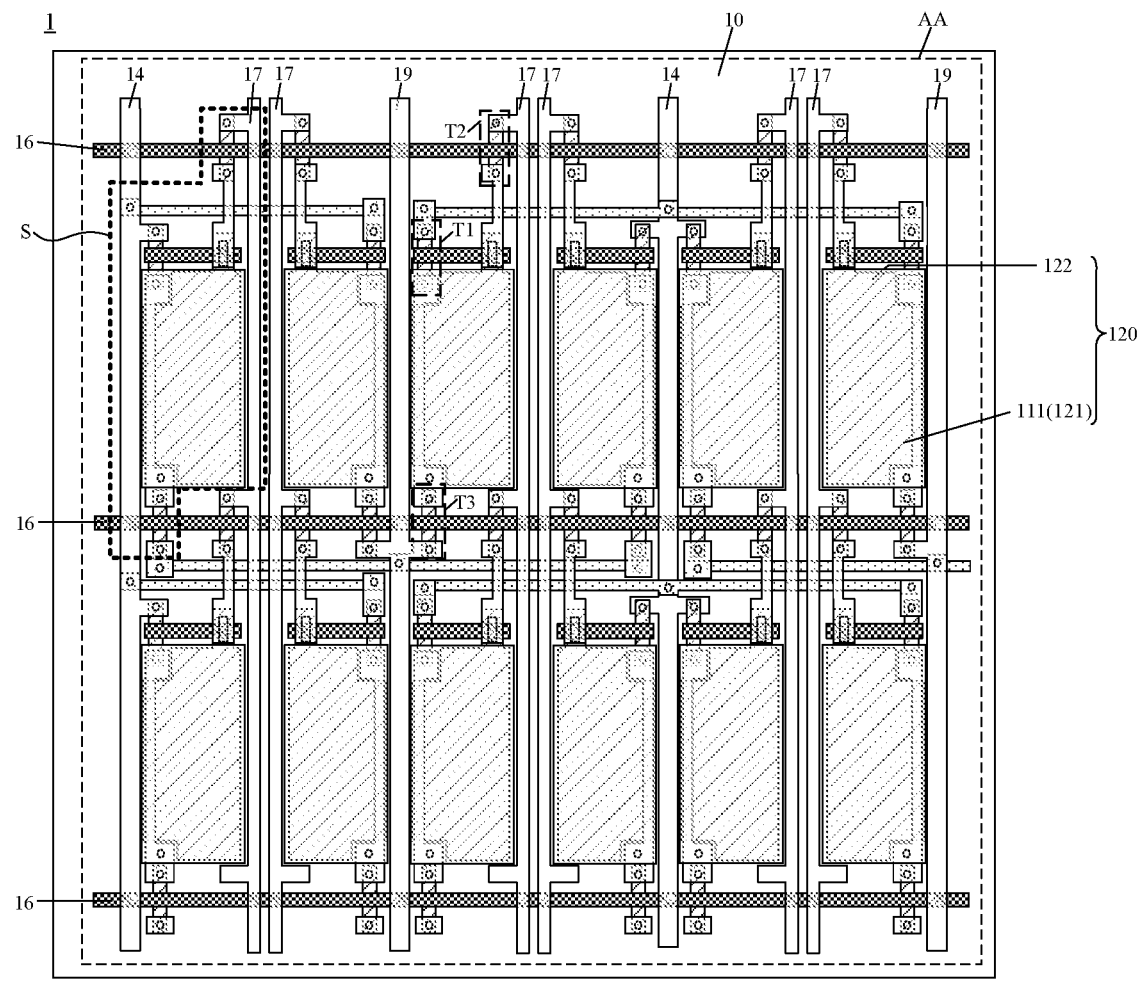
FIG. 1 is a schematic diagram showing a structure of a partial region of a display substrate, in accordance with some embodiments of the present disclosure.

The technical solutions in the embodiments of the present disclosure will be described below clearly and completely with reference to the accompanying drawings in the embodiments of the present disclosure. Obviously, the described embodiments are merely some but not all embodiments of the present disclosure. All other embodiments obtained based on the embodiments of the present disclosure by a person of ordinary skill in the art without paying any creative effort shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first", "second", and other ordinal numbers are used for descriptive purposes only, and are not to be construed as indicating or implying the relative importance or implicitly indicating the number of indicated technical features. Thus, features defined as "first", "second" and the like may explicitly or implicitly include one or more of the features. In the description of the embodiments of the present disclosure, the term "a plurality of" or "the plurality of" means two or more unless otherwise specified.

In the description of some embodiments, the terms "electrically connected" and "in contact with" and their derivatives may be used. For example, the term "electrically connected" or "in contact with" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

As used herein, depending on the context, the term "if" is optionally construed as "when" or "in a case where" or "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

In the related art, each sub-pixel of a self-luminescent display substrate is provided with a pixel driving circuit and a light-emitting device electrically connected to the pixel driving circuit therein. In a case where an area of a single sub-pixel is limited, a storage capacitor in the pixel driving circuit and the light-emitting device are located in different regions of the sub-pixel, so that a crossover line may be formed at an electrical connection position between the storage capacitor and the light-emitting device, thereby increasing a risk of crosstalk. Moreover, if an overlapping area of the storage capacitor is set to be large, an area of the sub-pixel required occupied by the storage capacitor is also large. As a result, for a bottom-emission display substrate in which the pixel driving circuit is located on a light-exit side of the light-emitting device, the storage capacitor occupying a large area of the sub-pixel may easily cause a small aperture ratio of the sub-pixel and a small light-emitting area of the light-emitting device. Therefore, in a case where the display brightness is same, the smaller the light-emitting area of the light-emitting device is, the larger a current density that is required is. As a result, an aging speed of the light-emitting device is easily accelerated, and a service life of the light-emitting device is easily affected. However, if the overlapping area of the storage capacitor is set to be small, capacitance of the storage capacitor is likely to be small, and further, a problem of uneven quality of an image displayed by the display substrate may occur.

Figure 2A:
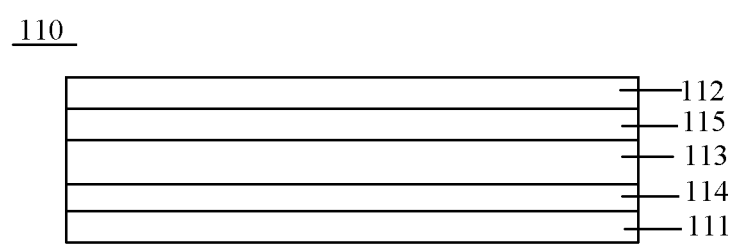
FIG. 2A is a schematic diagram showing a structure of a bottom-emission light-emitting device, in accordance with some embodiments of the present disclosure.
Figure 2B:
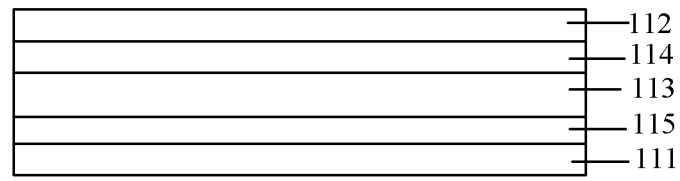
FIG. 2B is a schematic diagram showing a structure of another bottom-emission light-emitting device, in accordance with some embodiments of the present disclosure.
Figure 3:
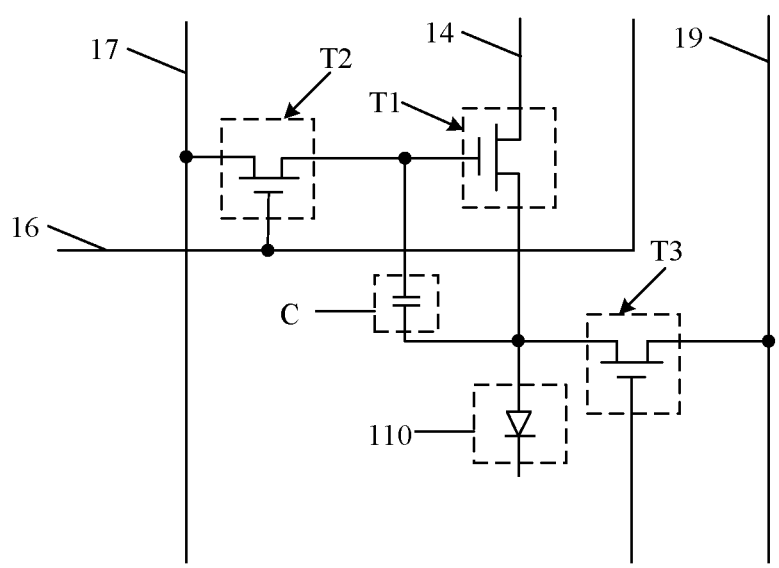
FIG. 3 is an equivalent circuit diagram of a pixel driving circuit, in accordance with some embodiments of the present disclosure.

Referring to FIGS. 1 to 3, some embodiments of the present disclosure provide a display substrate 1. The display substrate 1 has a display area AA, and the display area AA of the display substrate 1 are provided with a plurality of sub-pixels S. The display substrate 1 includes a base 10, and a pixel driving circuit and a bottom-emission light-emitting device 110 that are disposed on the base 10 and located in each sub-pixel S in the display area AA. The pixel driving circuit includes a first storage capacitor 120. The first storage capacitor 120 includes a first storage electrode 121 and a second storage electrode 122 that are disposed opposite to each other. The light-emitting device 110 includes a first electrode 111 electrically connected to the first storage capacitor 120 in the pixel driving circuit.

In the embodiments of the present disclosure, the first electrode 111 further serves as the first storage electrode 121, and both the first electrode 111 and the second storage electrode 122 are transparent electrodes.

Since the light-emitting device 110 is the bottom-emission light-emitting device, that is, the pixel driving circuit is located on a light-exit side of the light-emitting device 110, a person skilled in the art will understand that, in a case where the first electrode 111 further serves as the first storage electrode 121, the second storage electrode 122 is located on a side of the first storage electrode 121 proximate to the base 10.

It will be noted that, in FIG. 1, a distribution and a structure of sub-pixels S in only a partial region of the display substrate 1 are shown, and a structure of the light-emitting device 110 is also only partially shown.

As shown in FIGS. 2A and 2B, the light-emitting device 110 includes the first electrode 111, a second electrode 112, and a light-emitting layer 113 located between the first electrode 111 and the second electrode 112.

The first electrode 111 is an anode, and the second electrode 112 is a cathode; or, the first electrode 111 is a cathode, and the second electrode 112 is an anode.

It can be understood that, in a case where the first electrode 111 is the anode and the second electrode 112 is the cathode, the light-emitting device 110 is upright. In a case where the first electrode 111 is the cathode and the second electrode 112 is the anode, the light-emitting device 110 is inverted.

Further, as shown in FIG. 2A, in the case where the first electrode 111 is the anode and the second electrode 112 is the cathode, the light-emitting device 110 further includes a hole transport layer 114 located between the light-emitting layer 113 and the first electrode 111, and an electron transport layer 115 located between the light-emitting layer 113 and the second electrode 112. Of course, in some embodiments, according to needs, a hole injection layer may be disposed between the hole transport layer 114 and the first electrode 111, and an electron injection layer may be disposed between the electron transport layer 115 and the second electrode 112.

Or, as shown in FIG. 2B, in the case where the first electrode 111 is the cathode and the second electrode 112 is the anode, the light-emitting device 110 further includes a hole transport layer 114 located between the light-emitting layer 113 and the second electrode 112, and an electron transport layer 115 located between the light-emitting layer 113 and the first electrode 111. Of course, a hole injection layer may be disposed between the hole transport layer 114 and the second electrode 112, and an electron injection layer may be disposed between the electron transport layer 115 and the first electrode 111.

Further, the light-emitting layer 113 is an organic light-emitting layer or a quantum dot light-emitting layer.

A material of the first electrode 111 is indium tin oxide (ITO), and a material of the second electrode 112 is silver (Ag), which are not limited thereto.

It will be noted that, the pixel driving circuit subsequently involved in the embodiments of the present disclosure will be described with the light-emitting device 110 as an upright light-emitting device. In addition, a pixel defining layer is usually disposed in the display substrate 1. The light-emitting device 110 is formed in a corresponding opening of the pixel defining layer, and an opening area of the pixel defining layer may be used to define a light-emitting area of the sub-pixel S. A material of the pixel defining layer may be a transparent resin material.

In the display substrate 1 provided by the embodiments of the present disclosure, the first electrode 111 of the light-emitting device 110 further serves as the first storage electrode 121, and both the first electrode 111 and the second storage electrode 122 are set as transparent electrodes, so that the first storage capacitor 120 may be disposed in a region directly opposite to the light-emitting device 110, that is, the first storage capacitor 120 is located in a light-emitting region of the light-emitting device 110, and does not affect light-emitting effect of the light-emitting device 110. In this way, in an aspect, the first electrode 111 of the light-emitting device 110 further serves as the first storage electrode 121 of the first storage capacitor 120, so that the crossover line may be avoided when the light-emitting device 110 is electrically connected to the first storage capacitor 120, thereby avoiding a risk of crosstalk. In another aspect, in a case of ensuring a normal display of the display substrate 1, the first storage capacitor 120 may not additionally occupy an area the light-emitting region in the sub-pixel S. As a result, in a case where the sub-pixel S has a certain area, the light-emitting device 110 may occupy a large area of the sub-pixel S, thereby increasing the aperture ratio of the sub-pixel S. In yet another aspect, both the first electrode 111 and the second storage electrode 122 are transparent electrodes, so that an area of the second storage electrode 122 may be set as large as possible, thereby effectively increasing capacitance of the first storage capacitor 120, and avoiding a problem of uneven quality of an image display by the display substrate 1.

In a case where the display substrate 1 in the embodiments of the present disclosure is applied as a display substrate with pixels per inch (PPI) of 8K, compared with that an average aperture ratio of the sub-pixels in the related art is approximately 12%, an average aperture ratio of the sub-pixels in the display substrate may be increased to approximately 17%, which is effectively increased by approximately 40%. In addition, compared with that the capacitance of the storage capacitor in the related art is approximately 0.13 pF, the capacitance of the storage capacitor (i.e., the first storage capacitor 120) in the display substrate may be increased to 0.17 pF, which is effectively increased by 30%.

The structure of the pixel driving circuit may be selectively set according to actual needs. For example, a pixel circuit of a 3T1C structure shown in FIG. 3 is adopted. That is, the pixel circuit may be composed of three transistors T and a storage capacitor C. The three transistors are a first transistor T1, a second transistor T2 and a third transistor T3, and the storage capacitor C is the first storage capacitor 120 in some embodiments described above. Of course, the pixel driving circuit may also have a structure including other numbers of transistors or other numbers of storage capacitors, which is not limited in the embodiments of the present disclosure.

The following embodiments will be described by taking an example in which the pixel driving circuit is the 3T1C pixel circuit.

Figure 4:
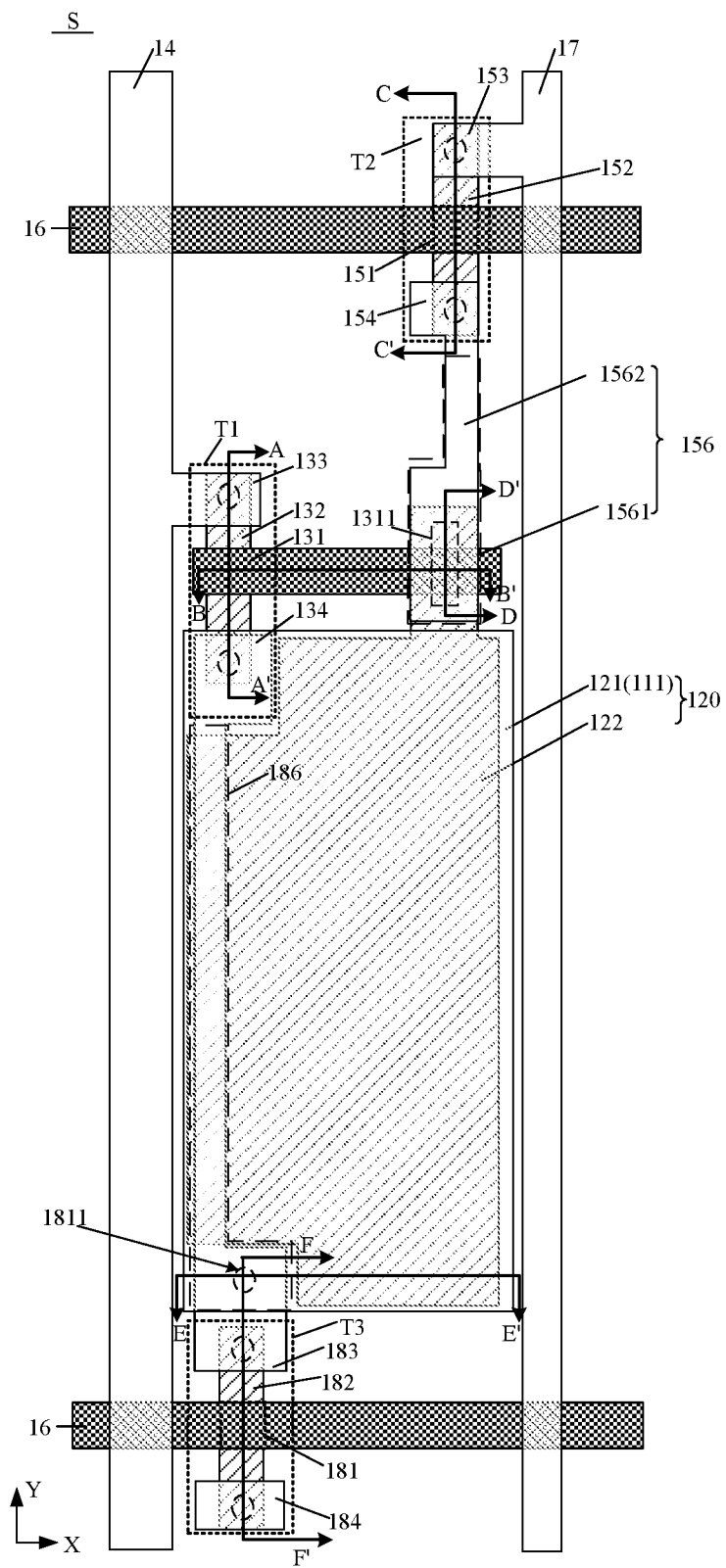
FIG. 4 is a schematic diagram showing a structure of a sub-pixel S in the display substrate shown in FIG. 1.
Figure 5:
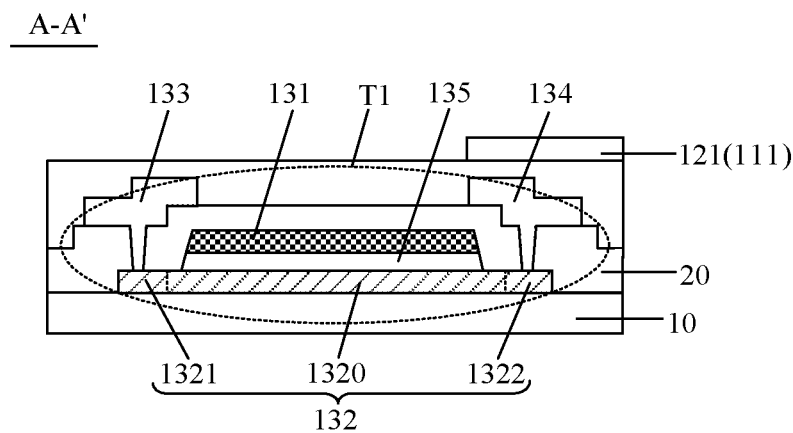
FIG. 5 is a cross-sectional view of the sub-pixel S shown in FIG. 4 taken along the line AA'.

The structure of the pixel driving circuit in a single sub-pixel S is as shown in FIGS. 3 and 4, and the pixel driving circuit further includes a first transistor T1, which is a driving transistor. As shown in FIG. 5, the first transistor T1 includes a first gate 131, a first semiconductor active pattern 132, a first source 133 and a first drain 134.

It can be understood with reference to FIGS. 3 to 5 that, the first source 133 is electrically connected to a power line 14, and the first drain 134 is electrically connected to the first electrode 121.

The first semiconductor active pattern 132 includes a first channel portion 1320, a first source portion 1321 and a first drain portion 1322, and conductivities of the first source portion 1321 and the first drain portion 1322 are greater than a conductivity of the first channel portion 1320. The first source 133 is in contact with the first source portion 1321, and the first drain 134 is in contact with the first drain portion 1322.

The second storage electrode 122 may be obtained by performing a conducting processing on a semiconductor pattern, that is, the second storage electrode 122 is an electrode obtained by performing a conducting processing on the semiconductor pattern. Based on this, the second storage electrode 122 is disposed in a same layer and made of a same material as the first source portion 1321 and the first drain portion 1322.

For example, different regions of a semiconductor layer may be subjected to a treatment for converting them into conductors in a manner of ion implantation, so as to form the second storage electrode 122 and the first source portion 1321 and the first drain portion 1322 in the first semiconductor active pattern 132. There is a gap between the first source portion 1321 and the first drain portion 1322, and a portion of the semiconductor layer in the gap is the first channel portion 1321 in the first semiconductor active pattern 132. The ions implanted into the semiconductor layer may be boron ions or phosphorus ions.

It will be noted that, FIGS. 4 and 5 show an example in which the first transistor T1 is a top-gate thin film transistor. In this case, as shown in FIG. 5, the first semiconductor active pattern 132 is disposed on a side of the first gate 131 proximate to the base 10, the first semiconductor active pattern 132 and the first gate 131 are insulated through a first gate insulating pattern 135, and both the first source 133 and the first drain 134 are insulated from the first gate 131 through an interlayer insulating layer 20.

As shown in FIG. 5, the first gate insulating pattern 135 and the first gate 131 are formed simultaneously. Based on this, the first source 133 and the first drain 134 are in contact with the first semiconductor active pattern 132 through via holes penetrating the interlayer insulating layer 20.

Herein, "being formed simultaneously" refers to formation by using a same patterning process, such as a mask process. "Being formed simultaneously" involved in the embodiments of the present disclosure may be understood in this way, but is not limited thereto.

It can be understood that, in a case where a gate insulating layer between the first semiconductor active pattern 132 and the first gate 131 is not patterned, the first source 133 and the first drain 134 are in contact with the first semiconductor active pattern 132 through via holes penetrating the interlayer insulating layer 20 and the gate insulating layer.

Figure 6:
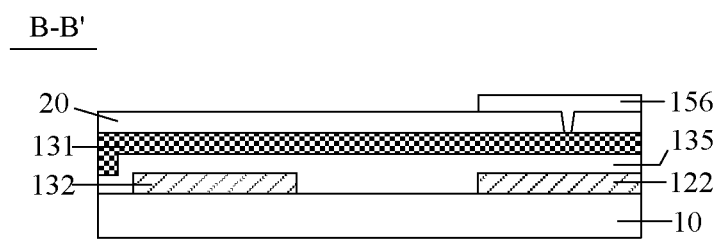
FIG. 6 is a cross-sectional view of the sub-pixel S shown in FIG. 4 taken along the line BB'.

Referring to FIG. 6, in the embodiments of the present disclosure, the semiconductor pattern is formed while the first semiconductor active pattern 132 of the first transistor T1 is formed, and the second storage electrode 122 is obtained by performing the conducting processing on the semiconductor pattern, so that the second storage electrode 122 may be formed without adding an additional patterning process.

Further, as shown in FIGS. 4, 7, 11 and 12, the pixel driving circuit further includes a second transistor T2, and the second transistor T2 includes a second gate 151, a second semiconductor active pattern 152, a second source 153 and a second drain 154.

Figure 7:
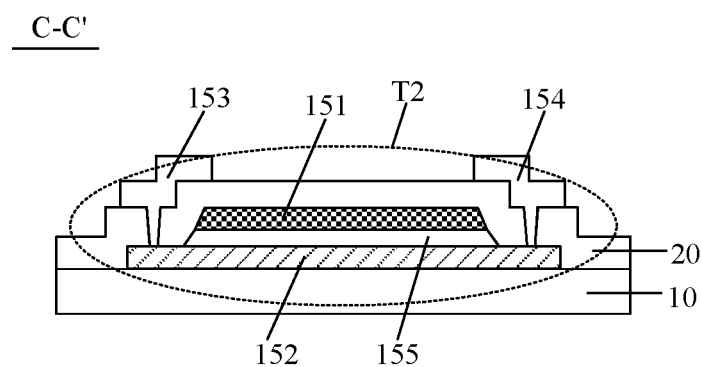
FIG. 7 is a cross-sectional view of the sub-pixel S shown in FIG. 4 taken along the line CC'.

It will be noted that, FIGS. 4 and 7 show an example in which the second transistor T2 is a top-gate thin film transistor. In this case, the second semiconductor active pattern 152 is disposed on a side of the second gate 151 proximate to the base 10, the second semiconductor active pattern 152 and the second gate 151 are insulated through a second gate insulating pattern 155, and both the second source 153 and the second drain 154 are insulated from the second gate 151 through the interlayer insulating layer 20.

As shown in FIG. 7, the second gate insulating pattern 155 and the second gate 151 are formed synchronously. Based on this, the second source 153 and the second drain 154 are in contact with the second semiconductor active pattern 152 through via holes penetrating the interlayer insulating layer 20. In addition, similar to the first transistor T1, in a case where a gate insulating layer between the second semiconductor active pattern 152 and the second gate 151 is not patterned, the second source 153 and the second drain 154 are in contact with the second semiconductor active pattern 152 through via holes penetrating the interlayer insulating layer 20 and the gate insulating layer.

Figure 11:
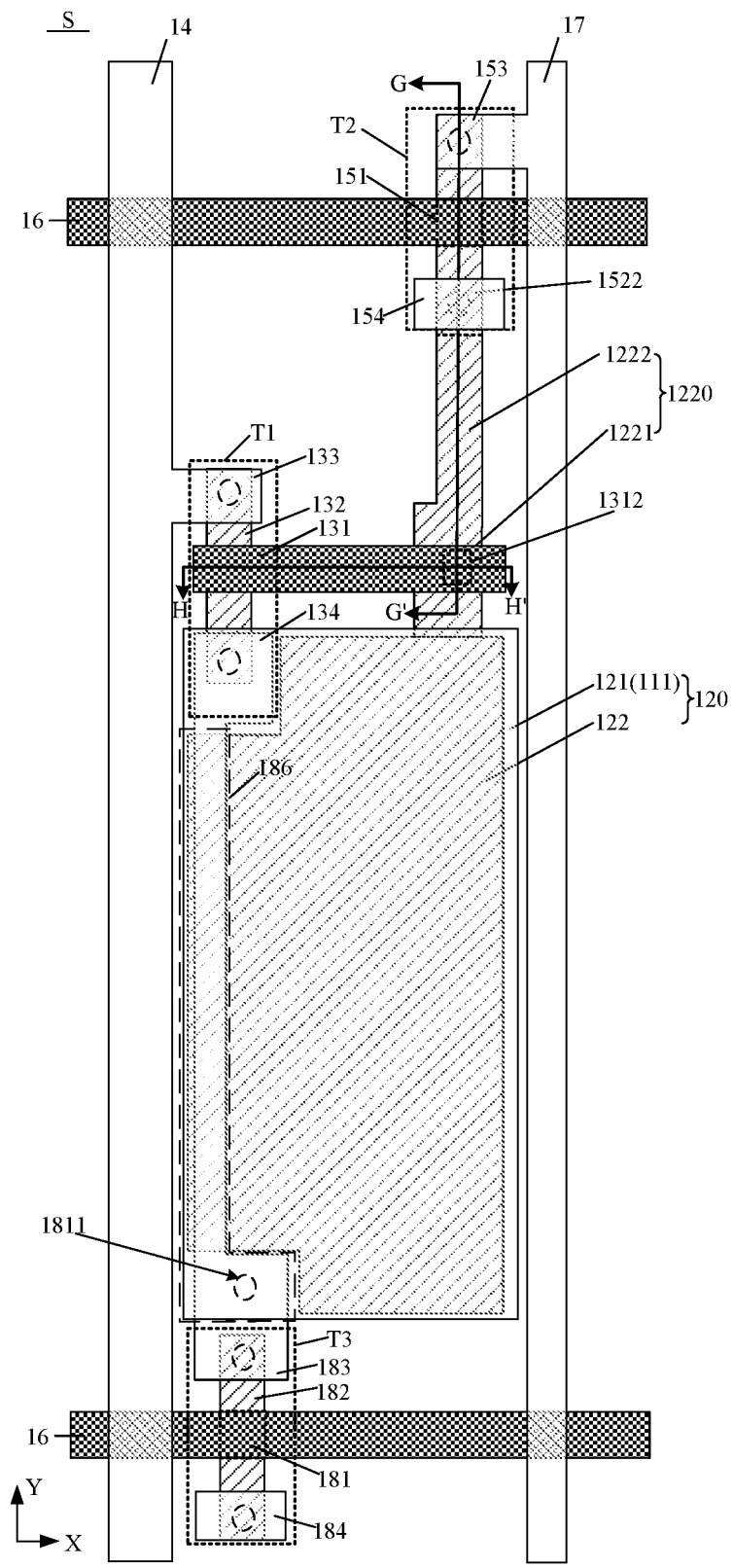
FIG. 11 is a schematic diagram showing a structure of another sub-pixel S in the display substrate shown in FIG. 1.

In some embodiments, as shown in FIGS. 4 and 11, a portion of a gate line 16 serves as the second gate 151, so that an area of the sub-pixel S occupied by the pixel driving circuit may be effectively reduced, and the aperture ratio of the sub-pixel may be increased. In addition, the second source 153 is electrically connected to a data line 17, and the second drain 154 is electrically connected to the second storage electrode 122 and the first gate 151.

Figure 8:
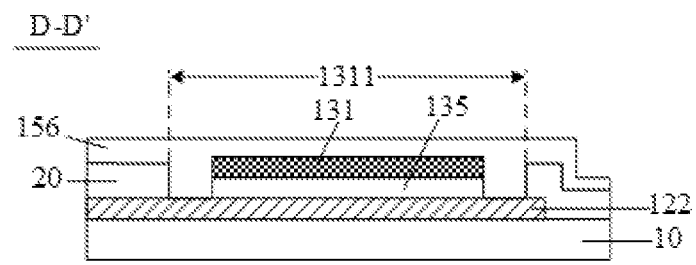
FIG. 8 is a cross-sectional view of the sub-pixel S shown in FIG. 4 taken along the line DD'.

In a possible embodiment, as shown in FIGS. 4 and 8, the display substrate 1 further includes first connection electrodes 156. The second drain 154 is electrically connected to a first connection electrode 156, and they are of an integrated structure. The first connection electrode 156 is electrically connected to the second storage electrode 122 and the first gate 131 through a first via hole 1311.

As shown in FIG. 4, there is a gap between the second drain 154 and the first gate 131 in a first direction (e.g., a Y direction), and the first gate 131 extends in a second direction (e.g., an X direction). Herein, the first direction and the second direction are perpendicular or substantially perpendicular. That is, an included angle between the first direction and the second direction is 90° or approximately 90°, for example, slightly less than 90° or slightly greater than 90°. Based on this, the first connection electrode 156 extends in the first direction. A dimension of a portion of the first connection electrode 156 that is electrically connected to the second drain 154 in the second direction is smaller than a dimension of a portion of the first connection electrode 156 that is electrically connected to the first gate 131 in the second direction, which facilitates to reduce the area of the sub-pixel S occupied by the pixel driving circuit, and to increase the aperture ratio of the sub-pixel. That is, the first connection electrode 156 includes a first connection portion 1561 and a second connection portion 1562. The first connection portion 1561 is a portion, an orthogonal projection of which on the base overlaps with an orthogonal projection of the first gate 131 on the base, of the first connection electrode 156, and the second connection portion 1562 is a portion, which is located at a side of the first connection portion 1561 proximate to the second drain 154, of the first connection electrode 156. A dimension of the first connection portion 1561 in the second direction is larger than a dimension of the second connection portion 1562 in the second direction.

Figure 12:
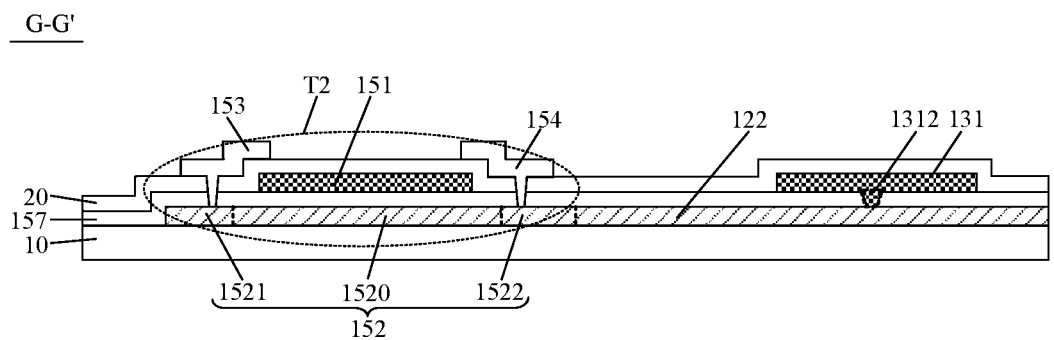
FIG. 12 is a cross-sectional view of the sub-pixel S shown in FIG. 11 taken along the line GG'.
Figure 13:
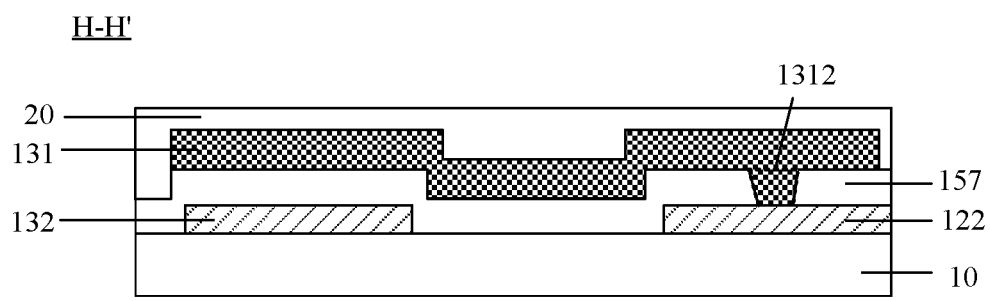
FIG. 13 is a cross-sectional view of the sub-pixel S shown in FIG. 11 taken along the line HH'.

In another possible embodiment, as shown in FIGS. 11 and 12, the second semiconductor active pattern 152 and the first semiconductor active pattern 132, which are formed simultaneously, have a similar structure, that is, the second semiconductor active pattern 152 includes a second channel portion 1520, a second source portion 1521, and a second drain portion 1522. The second source 153 is in contact with the second source portion 1521, and the second drain 154 is in contact with the second drain portion 1522. The second storage electrode 122 is in contact with the second drain portion 1522 in the second semiconductor active pattern 152, and the second storage electrode 122 and the second drain portion 1522 are of an integrated structure. In addition, as shown in FIGS. 12 and 13, the second storage electrode 122 is electrically connected to the first gate 131 through a second via hole 1312.

As shown in FIG. 11, there is a gap between the second drain 154 and the first gate 131 in the first direction (i.e., the Y direction), and the first gate 131 extends in the second direction (i.e., the X direction). Herein, the first direction and the second direction are perpendicular or substantially perpendicular. That is, the included angle between the first direction and the second direction is 90° or approximately 90°, for example, slightly less than 90° or slightly greater than 90°. Based on this, it can be understood with reference to FIGS. 11 and 12 that, the second storage electrode 122 includes an extension portion 1220 that extends in the first direction and is electrically connected to the second drain portion 1522. A dimension of a portion of the extension portion 1220 that is electrically connected to the second drain portion 1522 in the second direction is smaller than a dimension of a portion of the extension portion 1220 that is electrically connected to the first gate 131 in the second direction, which facilitates to reduce the area of the sub-pixel S occupied by the pixel driving circuit, and to increase the aperture ratio of the sub-pixel. That is, the extension portion 1220 includes a first extension sub-portion 1221 and a second extension sub-portion 1222. The first extension sub-portion 1221 is a portion, an orthogonal projection of which on the base overlaps with an orthogonal projection of the first gate 131 on the base, of the extension portion 1220, and the second extension sub-portion 1222 is a portion, which is located at a side of the first extension sub-portion 1221 proximate to the second drain portion 1522, of the extension portion 1220. A dimension of the first extension sub-portion 1221 in the second direction is larger than a dimension of the second extension sub-portion 1222 in the second direction.

It will be noted that, FIGS. 11 and 12 show the example in which the second transistor T2 is the top-gate thin film transistor. In this case, the second semiconductor active pattern 152 is disposed on a side of the second gate 151 proximate to the base 10, the second gate 151 and the second semiconductor active pattern 152 are insulated through an unpatterned second gate insulating layer 157, and the second source 153 and the second drain 154 are insulated from the second gate 151 through the interlayer insulating layer 20. As shown in FIG. 12, the second source 153 and the second drain 154 are in contact with the second semiconductor active pattern 152 through via holes penetrating the interlayer insulating layer 20 and the second gate insulating layer 157.

As shown in FIGS. 4 and 11, the first source 133 of the first transistor T1 is electrically connected to the power line 14, and the first drain 134 is electrically connected to the first electrode 111. The power line 14 is used to supply power to the pixel driving circuit.

As shown in FIG. 4, in a case where the pixel driving circuit includes the second transistor T2, the pixel driving circuit further includes a third transistor T3. Based on this, as shown in FIGS. 4 and 10, the third transistor T3 includes a third gate 181, a third semiconductor active pattern 182, a third source 183 and a third drain 184.

Figure 10:
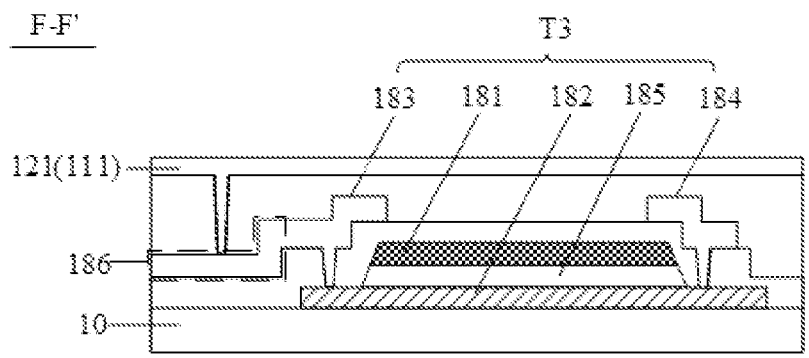
FIG. 10 is a cross-sectional view of the sub-pixel S shown in FIG. 4 taken along the line FF'.

It will be noted that, FIGS. 4 and 10 show an example in which the third transistor T3 is a top-gate thin film transistor. In this case, the third semiconductor active pattern 182 is disposed on a side of the third gate 181 proximate to the base 10, the third semiconductor active pattern 182 and the third gate 181 are insulated through a third gate insulating pattern 185, and both the third source 183 and the third drain 184 are insulated from the third gate 181 through the interlayer insulating layer 20. In a case where the first gate insulating pattern 135 and the first gate 131 are formed synchronously, as shown in FIG. 10, the third gate insulating pattern 185 and the third gate 181 are formed synchronously. Based on this, the third source 183 and the third drain 184 are in contact with the third semiconductor active pattern 182 through via holes penetrating the interlayer insulating layer 20. In addition, similar to the first transistor T1, in a case where a gate insulating layer between the third semiconductor active pattern 182 and the third gate 181 is not patterned, the third source 183 and the third drain 184 are in contact with the third semiconductor active pattern 182 through via holes penetrating the interlayer insulating layer 20 and the gate insulating layer. The third semiconductor active pattern 182 has a similar structure to the second semiconductor active pattern 152, and details will not be repeated herein.

In some embodiments, as shown in FIGS. 4 and 11, the first transistor T1 and the third transistor T3 are located on both sides of the first storage capacitor 120 in the first direction (i.e., the Y direction). The display substrate 1 further includes second connection electrodes 186. The third source 183 is electrically connected to the first drain 134 through a second connection electrode 186, and the third source 183, the second connection electrode 186 and the first drain 134 are of an integrated structure. As shown in FIG. 1, the display substrate 1 further includes sensing signal lines 19. The third drain 184 is electrically connected to a sensing signal line 19.

Figure 9A:
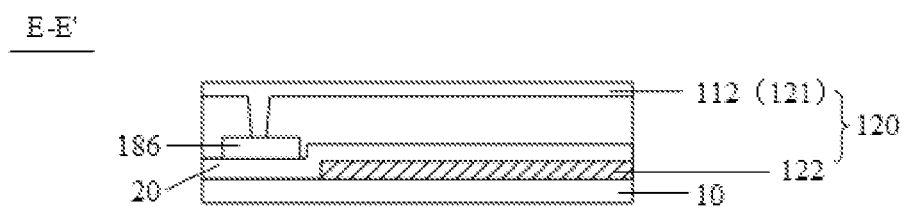
FIG. 9A is a cross-sectional view of the sub-pixel S shown in FIG. 4 taken along the line EE'.
Figure 9B:
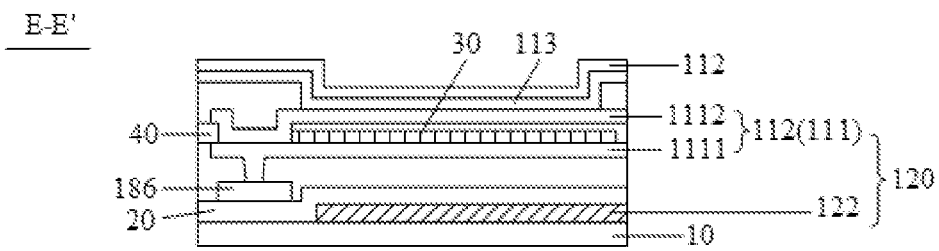
FIG. 9B is another cross-sectional view of the sub-pixel S shown in FIG. 4 taken along the line EE'.

It can be understood with reference to FIGS. 4, 9A and 10 that, the second connection electrode 186 is electrically connected to the first electrode 111 through a third via hole 1811. That is, the second connection electrode 186 is used to achieve electrical connection between the first electrode 111 and both the second drain 134 and the third source 183.

In a case where the pixel driving circuit includes the first transistor T1, the second transistor T2, the third transistor T3, and the first storage capacitor 120, an equivalent circuit diagram thereof is as shown in FIG. 3. Based on this, a parameter of the first transistor T1 may be sensed through the sensing signal line 19, and then a threshold voltage of the first transistor T1 may be compensated by means of external compensation.

Based on the above, for example, materials of the first gate 131, the second gate 151, the third gate 181, the first source 133, the second source 153, the third source 183, the first drain 134, the second drain 154, the third drain 184, the gate line 16, the data line 17, the power line 14 and the sensing signal line 19 may each be selected from at least one of metal elements such as copper (Cu), aluminum (Al), molybdenum (Mo), titanium (Ti), chromium (Cr) and tungsten (W), and metal alloys composed of these metal elements.

For example, materials of the first gate insulating pattern 136, the second gate insulating pattern 155, the third gate insulating pattern 185, and the interlayer insulating layer 20 may each be selected from one or more of inorganic oxides such as silicon nitride ($SiN_x$) and silicon dioxide ($SiO_2$). The first gate insulating pattern 136, the second gate insulating pattern 155, the third gate insulating pattern 185 and the interlayer insulating layer 20 may each have a single-layer structure or a multilayer stacked structure. Semiconductor materials of the first semiconductor active pattern 132, the second semiconductor active pattern 152 and the third semiconductor active pattern 182 may each be selected from transparent semiconductor oxides such as indium zinc oxide (IGZO).

As shown in FIG. 1, for third gates 181 of third transistors T3 in any row of sub-pixels S, portions of the gate line 16 connected to second transistors in an adjacent row of sub-pixels S closest to the third transistors T3 in the row of sub-pixels S serve as the third gates of the third transistors. This facilitates to reduce the area of the sub-pixel S occupied by the pixel driving circuit and to increase the aperture ratio of the sub-pixel in a case where the plurality of sub-pixels S are arranged in an array.

Figure 14:
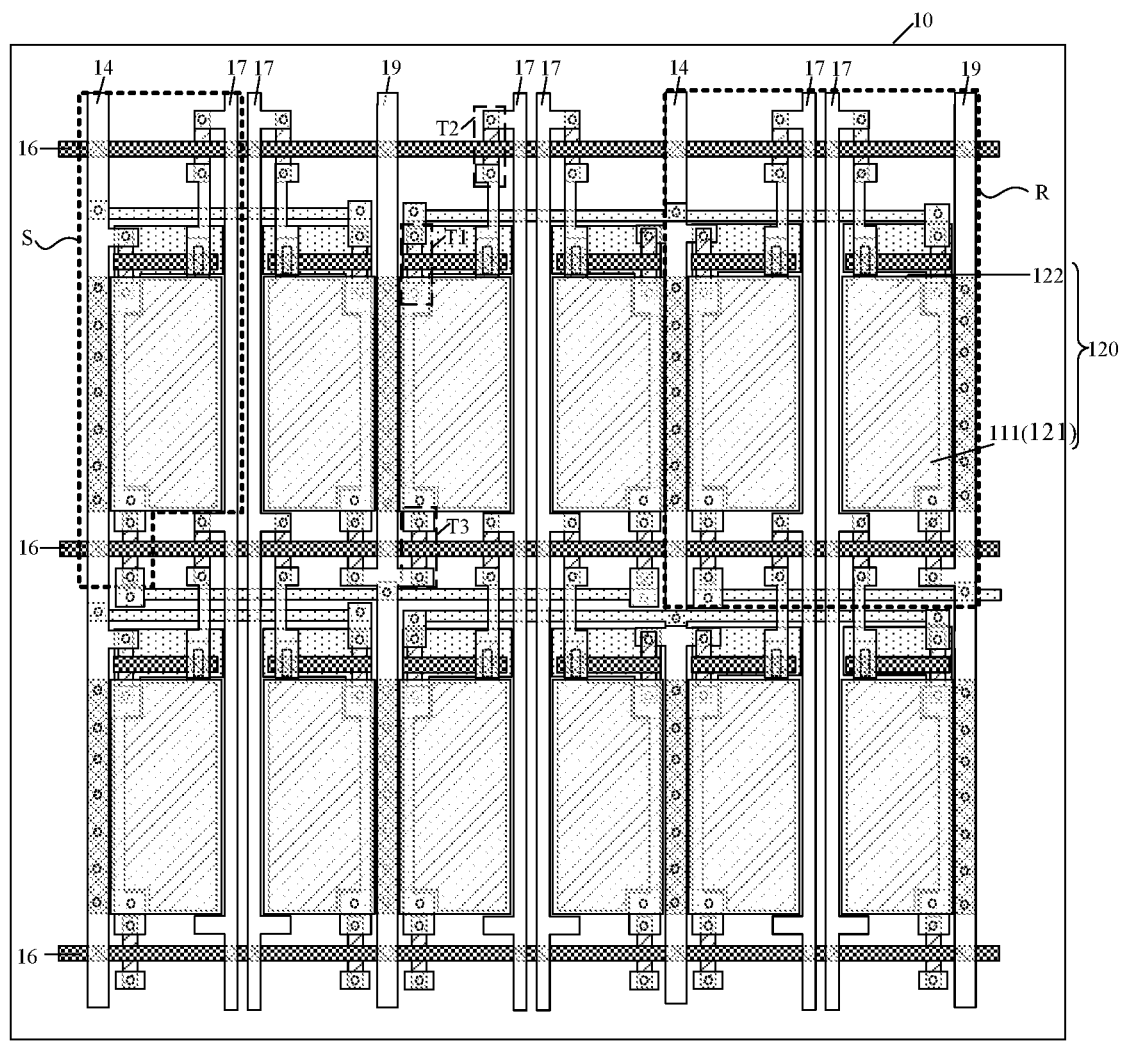
FIG. 14 is a schematic diagram showing a structure of a partial region of another display substrate, in accordance with some embodiments of the present disclosure.
Figure 15:
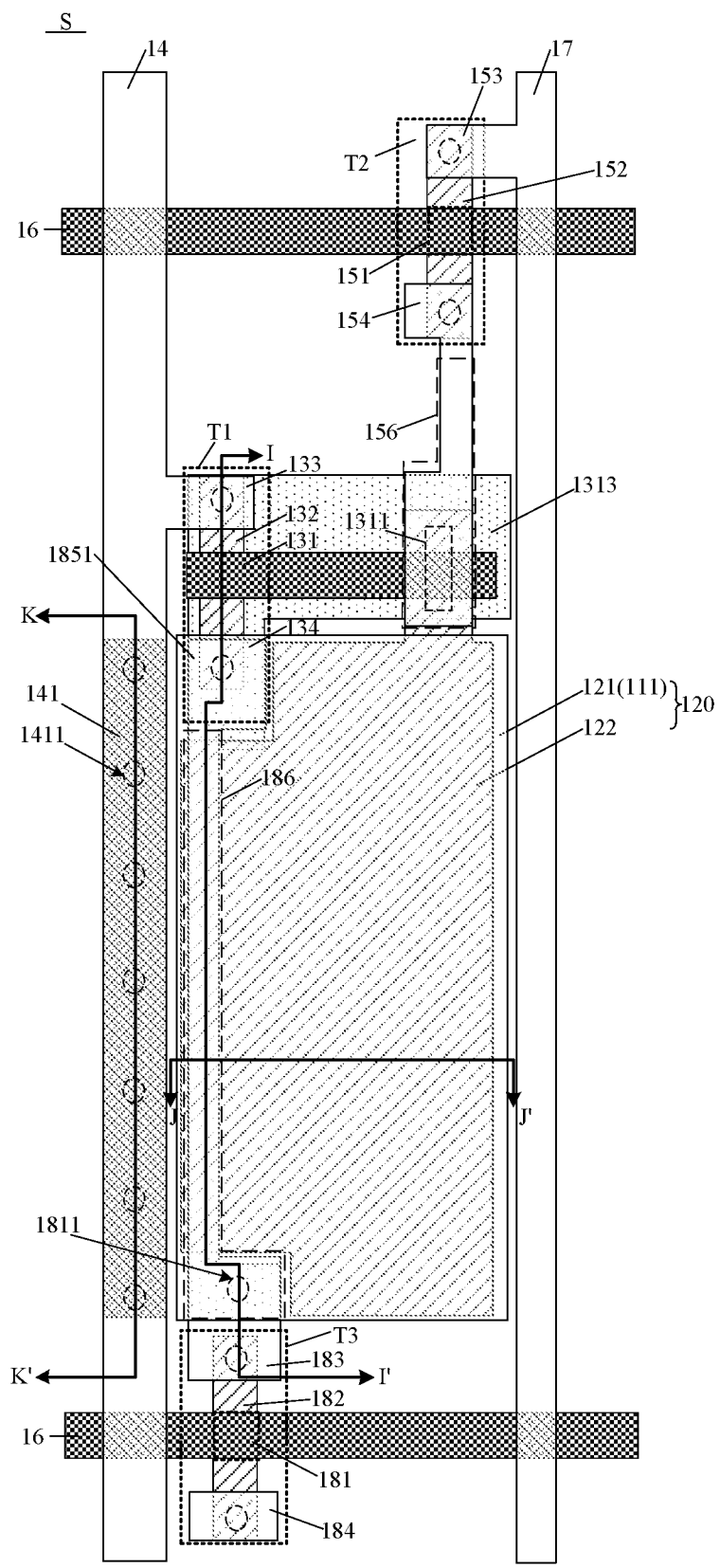
FIG. 15 is a schematic diagram showing a structure of a sub-pixel S in the display substrate shown in FIG. 14.
Figure 16:
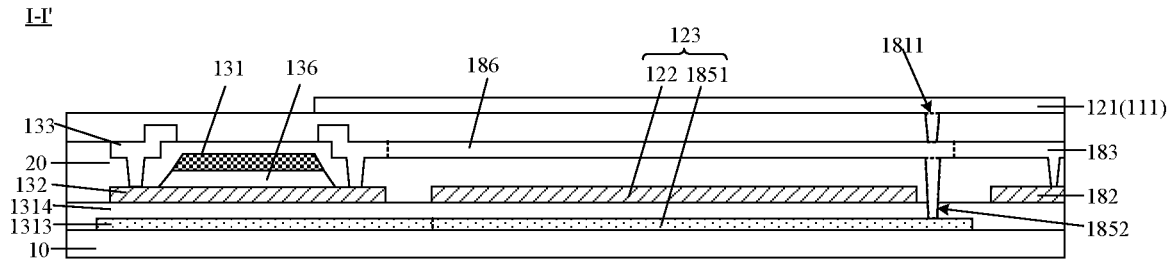
FIG. 16 is a cross-sectional view of the sub-pixel S shown in FIG. 15 taken along the line II'.
Figure 17A:
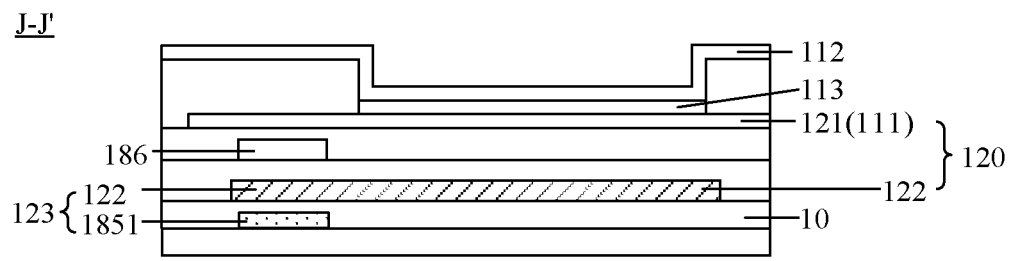
FIG. 17A is a cross-sectional view of the sub-pixel S shown in FIG. 15 taken along the line JJ'.
Figure 17B:
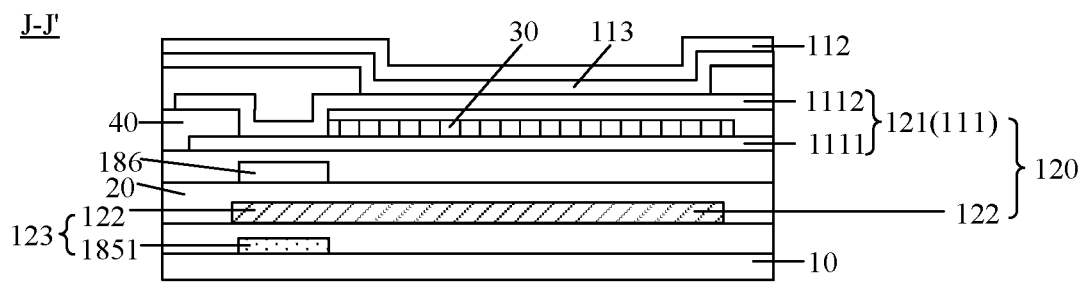
FIG. 17B is another cross-sectional view of the sub-pixel S shown in FIG. 15 taken along the line JJ'.

In a case where the first transistor T1 is the top-gate thin film transistor, it can be understood with reference to FIGS. 14 to 16 that, the display substrate 1 further includes first metal patterns 1313 each disposed on a side of the first semiconductor active pattern 132 proximate to the base 10. In a thickness direction of the base 10, an orthogonal projection of the first semiconductor active layer 131 on the base 10 is within an orthogonal projection of the first metal pattern 1313 on the base 10. In addition, the first semiconductor active pattern 132 and the first metal pattern 1313 are insulated through an insulating layer 1314.

Further, it can be understood with reference to FIGS. 14 to 17A and 20 that, the display substrate 1 further includes second metal patterns 1851. In the thickness direction of the base 10, an orthogonal projection of a second metal pattern 1851 on the base 10 and an orthogonal projection of the second connection electrode 186 on the base 10 at least partially overlap. The first metal pattern 1313 and the second metal pattern 1851 in the sub-pixel are of an integrated structure. The second metal pattern 1851 is electrically connected to the second connection electrode 186 through a fourth via hole 1852. Since the second connection electrode 186 is electrically connected to the first electrode 111 through the third via hole 1811, the second metal pattern 1851 is further electrically connected to the first electrode 111.

In addition, the storage capacitors C in the pixel driving circuit includes the first storage capacitor 120 and a second storage capacitor 123 connected in parallel with the first storage capacitor 120. In this way, the second storage capacitor 123 may be composed of at least a part of the second storage electrode 122 and at least a part of the second metal pattern 1851. That is, for two electrodes of the second storage capacitor 123, at least a part of the second storage electrode 122 and at least a part of the second metal pattern 1851 may serve as the two electrodes.

In the embodiments of the present disclosure, in an aspect, the first metal pattern 1313 may prevent external light from being incident on the first semiconductor active pattern 132, thereby preventing the external light from adversely affecting performance of the first transistor T1. In another aspect, by arranging the second metal pattern 1851, the second storage capacitor 123 connected in parallel with the first storage capacitor 120 may be formed by using the second storage electrode 122 and the second metal pattern 1851, so that the storage capacitors C of the pixel driving circuit may include the first storage capacitor 120 and the second storage capacitor 123. As a result, capacitance of the storage capacitors C in the pixel driving circuit may be increased, and the problem of uneven quality of the image displayed by the display substrate 1 may be further avoided. In addition, the orthogonal projections of the second metal pattern 1851 and the second connection electrode 186 on the base 10 overlap, which may prevent the second metal pattern 1851 from affecting the aperture ratio of the sub-pixel S.

The first transistor T1, the second transistor T2, and the third transistor T3 are all top-gate thin film transistors, which may facilitate fabrication of the pixel driving circuit on the base.

As shown in FIGS. 1 and 14, the power lines 14, the sensing signal lines 19 and the data lines 17 are arranged in parallel and in a same layer, which facilitates to simplify a wiring design of various signal lines in the display substrate 1.

In some embodiments, as shown in FIG. 14, in each row of sub-pixels, every two adjacent sub-pixels S are as a group, and two data lines 17 are provided between the two sub-pixels S in each group. A position at a side of each group of sub-pixels is provided with one power line 14, and a position at an opposite side of the group of sub-pixels is provided with one sensing signal line 19, and the power lines 14 and the sensing signal lines 19 are arranged alternately.

For each row of sub-pixels, pixel driving circuits in two sub-pixels located at a side of the power line 14 and proximate to the power line 14, and pixel driving circuits in two sub-pixels located at the other side of the power line 14 and proximate to the power line 14, are all connected to the power line 14.

For each row of sub-pixels, pixel driving circuits in two sub-pixels located at a side of the sensing signal 19 and proximate to the sensing signal line 19, and pixel driving circuits in two sub-pixels located at the other side of the sensing signal line 19 and proximate to the sensing signal line 19, are all connected to the sensing signal line 19.

Based on this, total numbers of the power lines 14 and the sensing signal lines 19 may be reduced, thereby simplifying a manufacturing process of the display substrate 1.

Figure 18:
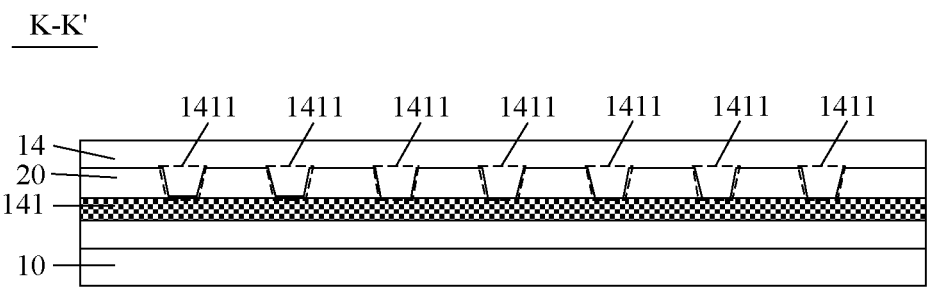
FIG. 18 is a cross-sectional view of the sub-pixel S shown in FIG. 15 taken along the line KK'.
Figure 19:
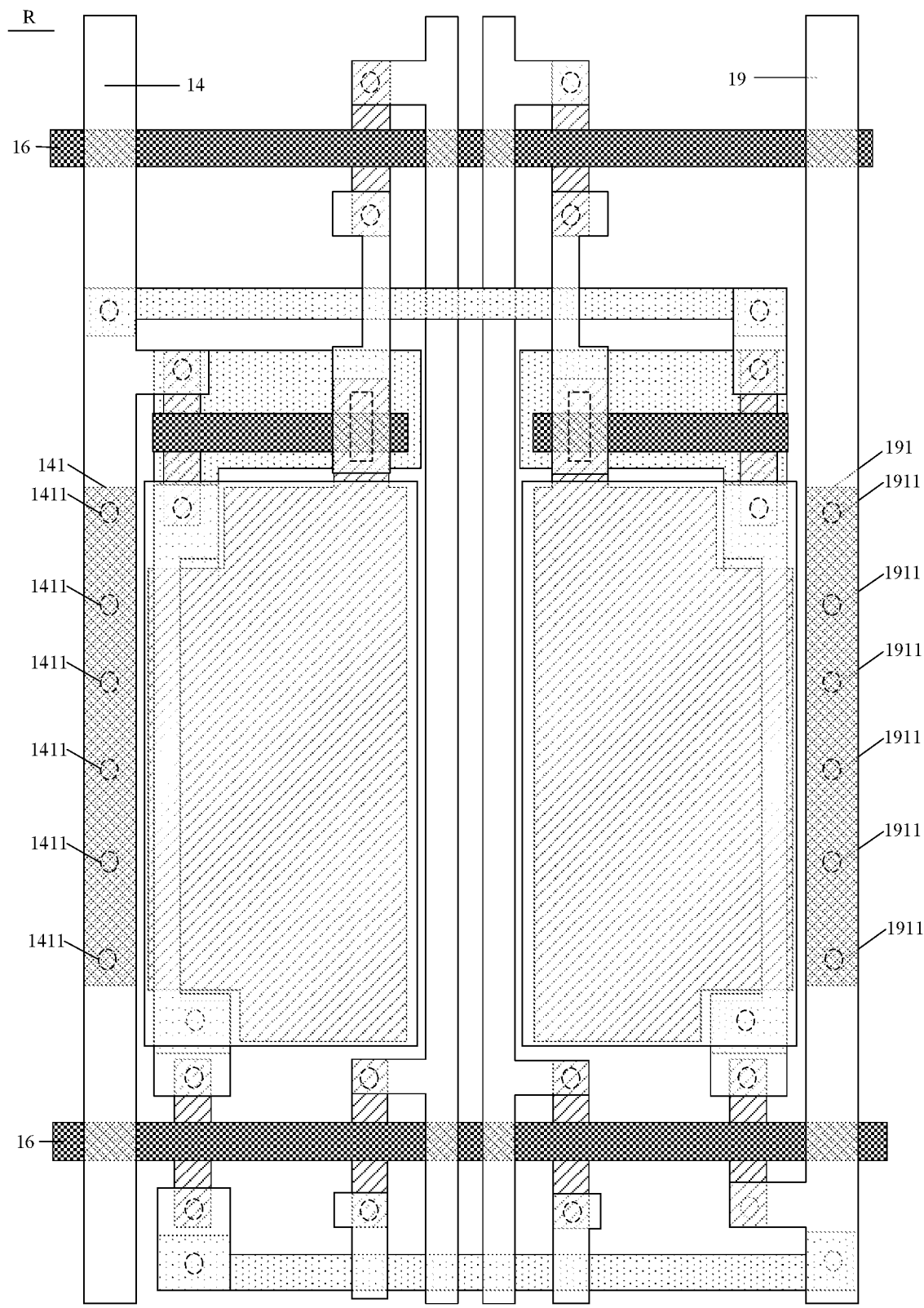
FIG. 19 is a schematic diagram showing a structure of the display substrate shown in FIG. 14 in the R region.
Figure 20:
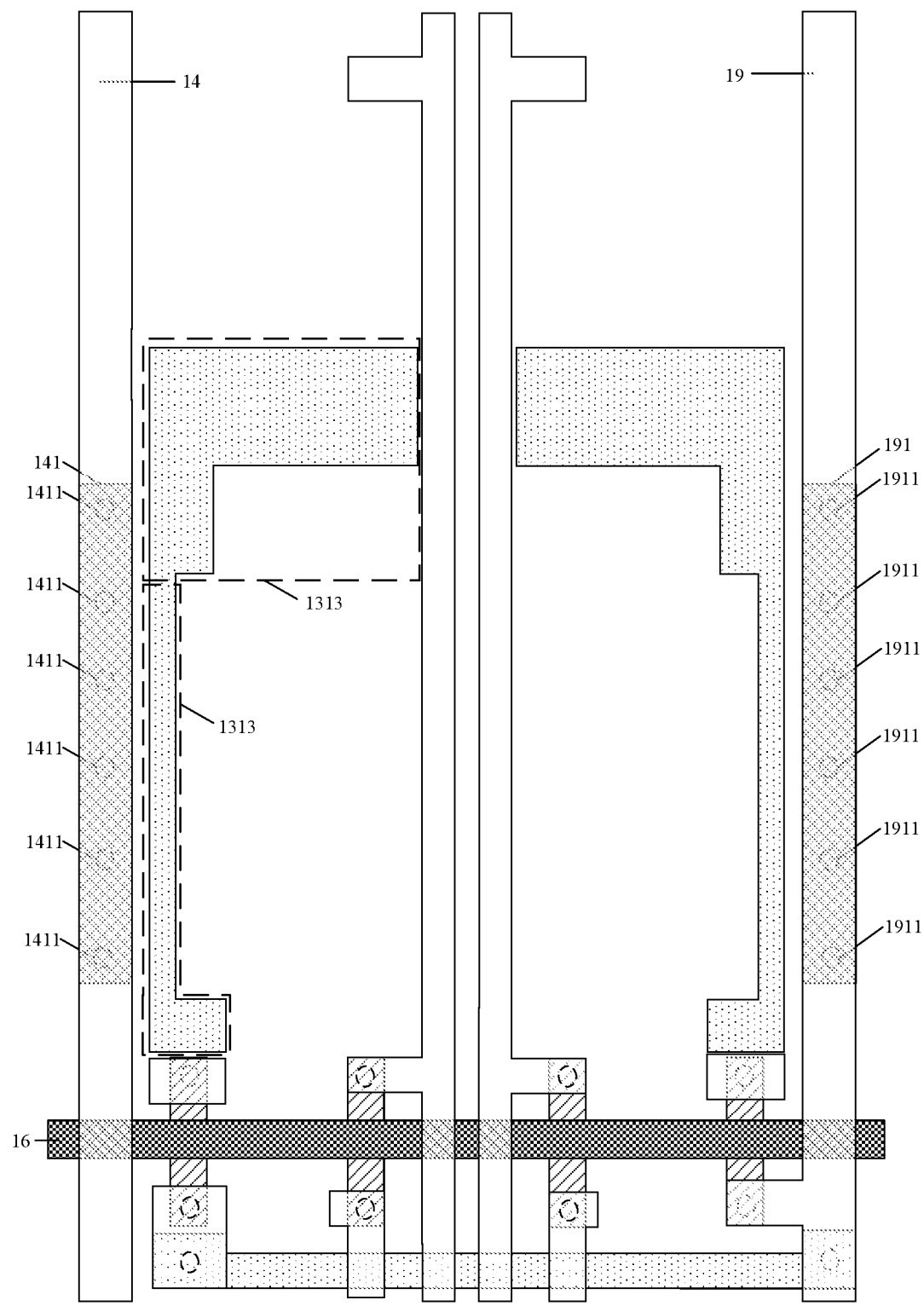
FIG. 20 is a schematic diagram showing partial structures in the R region shown in FIG. 19.

As shown in FIGS. 15, 18 and 19, the display substrate 1 further includes a first auxiliary electrode 141 corresponding to any power line 14. An orthogonal projection of the first auxiliary electrode 141 on the base 10 is within an orthogonal projection of the power line 14 on the base 10 in the thickness direction of the base 10. The first auxiliary electrode 141 is electrically connected to the power line 14 through a plurality of fifth via holes 1411. That is, the first auxiliary electrode 141 and the power line 14 are connected in parallel. This facilitates to reduce an equivalent resistance of the power line 14, thereby reducing a loss of signals transmitted by the power line 14.

Furthermore, as shown in FIG. 19, the display substrate 1 further includes a second auxiliary electrode 191 corresponding to any sensing signal line 19. An orthogonal projection of the second auxiliary electrode 191 on the base 10 is within an orthogonal projection of the sensing signal line 19 on the base 10 in the thickness direction of the base 10. The second auxiliary electrode 191 is electrically connected to the sensing signal line 19 through a plurality of sixth via holes 1911. That is, the second auxiliary electrode 191 and the sensing signal line 19 are connected in parallel. This facilitates to reduce an equivalent resistance of the sensing signal line 19, thereby reducing a loss of signals transmitted by the sensing signal line 19.

The first auxiliary electrode 141 and the second auxiliary electrode 191 are disposed in a same layer and made of a same material as the first gate 131. Based on this, the first auxiliary electrode 141 and the second auxiliary electrode 191 may be formed while the first gate 131 is formed, so that the manufacturing process of the display substrate 1 may be simplified.

In some embodiments, the display substrate 1 further includes a filter unit disposed in each sub-pixel S, so as to achieve color display of the display substrate 1 by using the filter unit. Based on this, as shown in FIGS. 4, 9B, 15 and 17B, the first electrode 111 includes a first sub-electrode 1111 and a second sub-electrode 1112 that are electrically connected. The second sub-electrode 1112 is disposed on a side of the first sub-electrode 1111 away from the base 10. The display substrate 1 further includes the filter unit 30 and a planarization layer 40 that are stacked between the first sub-electrode 1111 and the second sub-electrode 1112. The planarization layer 40 is located on a side of the filter unit 30 proximate to the second sub-electrode 1112. The second sub-electrode 1112 is formed on a surface of the planarization layer 40 away from the filter unit 30, which facilitates to ensure that the light-emitting layer 113 formed on the second sub-electrode 1112 has a good flatness, thereby ensuring uniform light emission of the display substrate 1.

Furthermore, the filter unit 30 is a color filter film.

Figure 21:
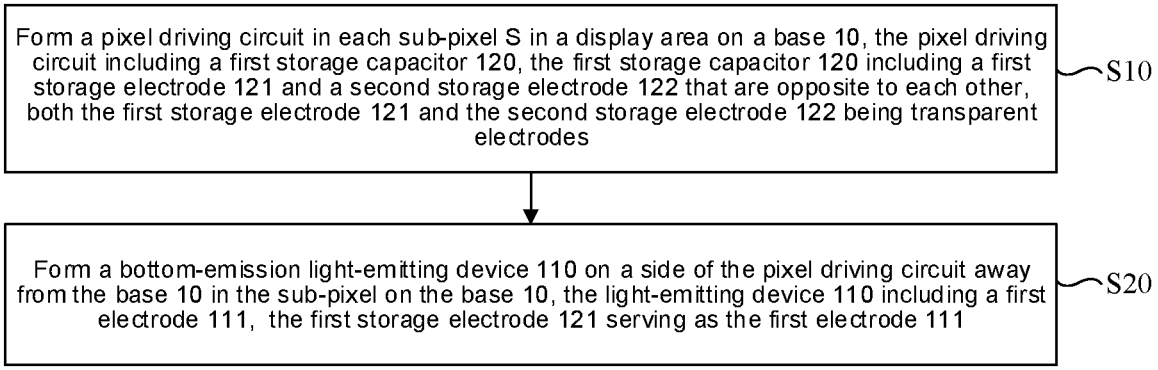
FIG. 21 is a schematic flow diagram of a method for manufacturing a display substrate, in accordance with some embodiments of the present disclosure.

Some embodiments of the present disclosure provide a method for manufacturing a display substrate 1. As shown in FIG. 21, the method for manufacturing the display substrate 1 includes S10 and S20.

In S10, as shown in FIGS. 1 and 4, a pixel driving circuit in each sub-pixel S is formed in a display area on a base 10. The pixel driving circuit includes a first storage capacitor 120. The first storage capacitor 120 includes a first storage electrode 121 and a second storage electrode 122 that are disposed opposite to each other. Both the first storage electrode 121 and the second storage electrode 122 are transparent electrodes.

A structure of the pixel driving circuit is as shown in some embodiments described above, and details will not be repeated herein.

In S20, a bottom-emission light-emitting device is formed on a side of the pixel driving circuit away from the base 10 in the sub-pixel S on the base 10.

As shown in FIGS. 2A and 2B, the light-emitting device 110 includes a first electrode 111. As shown in FIGS. 1 and 4, the first storage electrode 121 serves as the first electrode 111.

Beneficial effects that may be achieved by the method for manufacturing the display substrate provided by some embodiments of the present disclosure are the same as beneficial effects that may be achieved by the display substrate provided by the above embodiments, and details will not be repeated herein.

As shown in FIGS. 4 and 5, the pixel driving circuit further includes a first transistor T1. The first transistor T1 includes a first gate 131, a first semiconductor active pattern 132, a first source 133 and a first drain 134. The first transistor T1 is a driving transistor.

Structures of the first semiconductor active pattern 132 and the second storage electrode 122 are as shown in some embodiments described above. S10, in which the pixel driving circuit is formed, further includes: synchronously forming a semiconductor pattern used for forming the second storage electrode 122 in a process of forming the first semiconductor active pattern 132, and performing a conducting processing on the semiconductor pattern used for forming the second storage electrode 122 to obtain the second storage electrode 122. Therefore, a manufacturing process of the pixel driving circuit may be simplified.

As shown in FIGS. 4 and 7, the display substrate 1 further includes gate lines 16 and data lines 17. The pixel driving circuit further includes a second transistor T2. The second transistor T2 includes a second gate 151, a second semiconductor active pattern 152, a second source 153 and a second drain 154. A structure of the second semiconductor active pattern 152 is as shown in some embodiments described above.

Each sub-pixel S corresponds to a gate line 16, and a portion of the gate line 16 may further serve as the second gate 151. In this way, the method for manufacturing the display substrate 1 further includes: in a process of performing S10, synchronously forming the gate lines 16 and the first gate 131. Therefore, the manufacturing process of the display substrate may be simplified.

The second source 153 is electrically connected to a data line 17, and the second drain 154 is electrically connected to the first gate 131 and the second storage electrode 122. In this way, the method for manufacturing the display substrate 1 further includes: in a process of performing S10, synchronously forming the second semiconductor active pattern 152 and the first semiconductor active pattern 132, and synchronously forming the second source 153, the second drain 154, the data lines 17, the first source 133 and the first drain 134. Therefore, the manufacturing process of the display substrate may be simplified.

Based on this, as shown in FIGS. 4 and 10, the display substrate 1 further includes power lines 14 and sensing signal lines 19. The first source 133 is electrically connected to a power line 14, and the first drain 134 is electrically connected to the first electrode 111. The pixel driving circuit further includes a third transistor T3. The third transistor T3 includes a third gate 181, a third semiconductor active pattern 182, a third source 183 and a third drain 184. The third source 183 is electrically connected to the first drain 134 through a second connection electrode 186, and the third source 183, the second connection electrode 186 and the first drain 134 are of an integrated structure. The third drain 184 is electrically connected to a sensing signal line 19.

Furthermore, as shown in FIG. 1, for third gates 181 of third transistors T3 in any row of sub-pixels S, portions of the gate line 16 connected to second transistors in an adjacent row of sub-pixels S closest to the third transistors T3 in the row of sub-pixels S serve as the third gates of the third transistors.

In this way, the method for manufacturing the display substrate 1 further includes: synchronously forming the third semiconductor active pattern 182 and the first semiconductor active pattern 132 in a process of performing S10, and synchronously forming the third source 183, the third drain 184, the power lines 14 and the sensing signal lines 19 in a process of forming the data lines. Therefore, the manufacturing process of the display substrate may be further simplified.

As shown in FIGS. 14 to 16 and 20, in a case where the display substrate 1 further includes first metal patterns 1313 and second metal patterns 1851, the method for manufacturing the display substrate 1 further includes: synchronously forming a first metal pattern 1313 and a second metal pattern 1851 in the sub-pixel on the base 10 before S10 is performed, so that after S10 is performed, the first semiconductor active pattern 132 is formed on a side of the first metal pattern 1313 away from the base 10, and the second connection electrode 186 is formed on a side of the second metal pattern 1851 away from the base 10.

Structures and functions of the first metal pattern 1313 and the second metal pattern 1851 are as described in some embodiments described above, and details will not be repeated herein. For example, in the thickness direction of the base 10, an orthogonal projection of the first semiconductor active pattern 132 on the base 10 is within an orthogonal projection of the first metal pattern 1313 on the base 10, and an orthogonal projection of the second metal pattern 1851 on the base 10 and an orthogonal projection of the second connection electrode 186 on the base 10 at least partially overlap. The first metal pattern 1313 and the second metal pattern 1851 in the sub-pixel are of an integrated structure. The second metal pattern 1851 is electrically connected to the second connection electrode 186 through a fourth via hole 1852. The second metal pattern 1851 is electrically connected to the third source 183.

Figure 22:
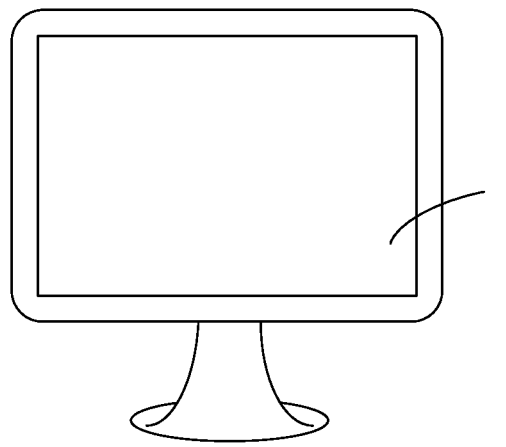
FIG. 22 is a schematic diagram showing a structure of a display apparatus, in accordance with some embodiments of the present disclosure.

Some embodiments of the present disclosure provide a display apparatus. As shown in FIG. 22, the display apparatus 1000 includes the display substrate 1 described in any one of the above embodiments. Beneficial effects that may be achieved by the display apparatus 1000 provided by the embodiments of the present disclosure are the same as the beneficial effects that may be achieved by the display substrate 1 provided by the above embodiments, and details will not be repeated herein.

In some embodiments, the display apparatus 1000 is a product or a component with a display function, such as an organic light-emitting diode (OLED) display panel, an OLED display, an OLED television, a mobile phone, a tablet computer, a notebook computer, an electronic paper, a digital photo frame or a navigator.

In the description of the above embodiments, the specific features, structures, materials, or characteristics may be combined in any suitable manner in any one or more embodiments or examples.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area provided with a plurality of sub-pixels, the display substrate comprising:
   a base, and
   a pixel driving circuit and a bottom-emission light-emitting device that are disposed on the base and located in each sub-pixel in the display area, wherein the light-emitting device includes a first electrode electrically connected to the pixel driving circuit;

the pixel driving circuit includes a first storage capacitor, and the first storage capacitor includes a first storage electrode and a second storage electrode that are disposed opposite to each other;

the first electrode further serves as the first storage electrode; both the second storage electrode and the first electrode are transparent electrodes;

the first electrode includes a first sub-electrode and a second sub-electrode that are disposed opposite to each other and electrically connected, and the second sub-electrode is disposed on a side of the first sub-electrode away from the base;

the display substrate further comprises a filter unit and a planarization layer that are stacked between the first sub-electrode and the second sub-electrode; wherein an orthographic projection of the filter unit lies within an orthographic projection of the first electrode; the planarization layer is located on a side of the filter unit proximate to the second sub-electrode.

2. The display substrate according to claim 1, further comprising power lines, wherein the pixel driving circuit further includes a first transistor; the first transistor includes a first gate, a first semiconductor active pattern, a first source and a first drain; the first transistor is a driving transistor;

the first source is electrically connected to a power line, and the first drain is electrically connected to the first electrode;

the first semiconductor active pattern includes a first channel portion, a first source portion and a first drain portion, and conductivities of the first source portion and the first drain portion are greater than a conductivity of the first channel portion; the first source is in contact with the first source portion, and the first drain is in contact with the first drain portion;

the second storage electrode is an electrode obtained by performing a conducting processing on a semiconductor pattern; the second storage electrode is disposed in a same layer and made of a same material as the first source portion and the first drain portion.

3. The display substrate according to claim 2, further comprising gate lines and data lines, wherein the pixel driving circuit further includes a second transistor, and the second transistor includes a second gate, a second semiconductor active pattern, a second source and a second drain;

a portion of a gate line serves as the second gate;

the second source is electrically connected to a data line;

the second drain is electrically connected to the second storage electrode and the first gate.

4. The display substrate according to claim 3, further comprising first connection electrodes, wherein a first connection electrode and the second drain are of an integrated structure, and the first connection electrode is electrically connected to the second storage electrode and the first gate through a first via hole.

5. The display substrate according to claim 4, wherein the second drain and the first gate have a gap therebetween in a first direction; the first gate extends in a second direction; the first direction and the second direction are substantially perpendicular;

the first connection electrode extends in the first direction; the first connection electrode includes a first connection portion and a second connection portion; the first connection portion is a portion, an orthogonal projection of which on the base overlaps with an orthogonal projection of the first gate on the base, of the first connection electrode; the second connection portion is a portion, which is located at a side of the first connection portion proximate to the second drain, of the first connection electrode; and a dimension of the first connection portion in the second direction is larger than a dimension of the second connection portion in the second direction.

6. The display substrate according to claim 3, wherein the second semiconductor active pattern includes a second channel portion, a second source portion, and a second drain portion; the second source is in contact with the second source portion, and the second drain is in contact with the second drain portion;

the second storage electrode and the second drain portion are of an integrated structure;

the second storage electrode is electrically connected to the first gate through a second via hole.

7. The display substrate according to claim 6, wherein the second drain and the first gate have a gap therebetween in a first direction; the first gate extends in a second direction; the first direction and the second direction are substantially perpendicular;

the second storage electrode includes an extension portion that extends in the first direction and is electrically connected to the second drain portion; the extension portion includes a first extension sub-portion and a second extension sub-portion; the first extension sub-portion is a portion, an orthogonal projection of which on the base overlaps with an orthogonal projection of the first gate on the base, of the extension portion; the second extension sub-portion is a portion, which is located at a side of the first extension sub-portion proximate to the second drain portion, of the extension portion; and a dimension of the first extension sub-portion in the second direction is larger than a dimension of the second extension sub-portion in the second direction.

8. The display substrate according to claim 3, wherein the pixel driving circuit further includes a third transistor, and the third transistor includes a third gate, a third semiconductor active pattern, a third source and a third drain;

the first transistor and the third transistor are located on both sides of the first storage capacitor in a first direction, the first direction is a direction in which the power lines extend;

the display substrate further comprises second connection electrodes and sensing signal lines;

the third source is electrically connected to the first drain through a second connection electrode, and the third source, the second connection electrode and the first drain are of an integrated structure;

the third drain is electrically connected to a sensing signal line;

the second connection electrode is electrically connected to the first electrode through a third via hole.

9. The display substrate according to claim 8, wherein for third gates of third transistors in any row of sub-pixels, portions of the gate line connected to second transistors in an adjacent row of sub-pixels closest to the third transistors in the row of sub-pixels serve as the third gates of the third transistors.

10. The display substrate according to claim 8, wherein the first transistor is a top-gate thin film transistor;

the display substrate further comprises first metal patterns each disposed on a side of the first semiconductor active pattern proximate to the base; in a thickness direction of the base, an orthogonal projection of the first semiconductor active pattern on the base is located within an orthogonal projection of a first metal pattern on the base;

the display substrate further comprises second metal patterns; in the thickness direction of the base, an orthogonal projection of a second metal pattern on the base and an orthogonal projection of the second connection electrode on the base at least partially overlap;

the first metal pattern and the second metal pattern in the sub-pixel are of an integrated structure;

the second metal pattern is electrically connected to the second connection electrode through a fourth via hole;

the pixel driving circuit further includes a second storage capacitor, and the second storage capacitor is composed of at least a part of the second storage electrode and at least a part of the second metal pattern.

11. The display substrate according to claim 10, wherein the power lines, the sensing signal lines and the data lines are arranged in parallel and in a same layer;

in each row of sub-pixels, every two adjacent sub-pixels are as a group, and two data lines are disposed between the two sub-pixels in each group; a position at a side of each group of sub-pixels is provided with one power line, and a position at an opposite side of the group of sub-pixels is provided with one sensing signal line, and the power lines and the sensing signal lines are arranged alternately;

for each row of sub-pixels, pixel driving circuits in two sub-pixels that are located at a side of the power line and proximate to the power line and pixel driving circuits in two sub-pixels that are located at another side of the power line and proximate to the power line are all connected to the power line;

for each row of sub-pixels, pixel driving circuits in two sub-pixels that are located at a side of the sensing signal line and proximate to the sensing signal line and pixel driving circuits in two sub-pixels that are located at another side of the sensing signal line and proximate to the sensing signal line are all connected to the sensing signal line.

12. The display substrate according to claim 11, further comprising: a first auxiliary electrode corresponding to any power line, and a second auxiliary electrode corresponding to any sensing signal line, wherein in the thickness direction of the base, an orthogonal projection of the first auxiliary electrode on the base is located within an orthogonal projection of the power line on the base; the first auxiliary electrode is electrically connected to the power line through a plurality of fifth via holes;

in the thickness direction of the base, an orthogonal projection of the second auxiliary electrode on the base is located within an orthogonal projection of the sensing signal line on the base; the second auxiliary electrode is electrically connected to the sensing signal line through a plurality of sixth via holes; and the first auxiliary electrode and the second auxiliary electrode are disposed in a same layer and made of a same material as the first gate.

13. A display apparatus, comprising the display substrate according to claim 1.

14. A method for manufacturing a display substrate, comprising:

forming a pixel driving circuit in each sub-pixel in a display area on a base, the pixel driving circuit including a first storage capacitor, the first storage capacitor including a first storage electrode and a second storage electrode that are opposite to each other, both the first storage electrode and the second storage electrode being transparent electrodes; and forming a bottom-emission light-emitting device in the sub-pixel on the base, the bottom-emission light-emitting device being located on a side of the pixel driving circuit away from the base; the light-emitting device including a first electrode, and the first storage electrode serving as the first electrode; wherein the first electrode includes a first sub-electrode and a second sub-electrode that are disposed opposite to each other and electrically connected, and the second sub-electrode is disposed on a side of the first sub-electrode away from the base;

the display substrate further comprises a filter unit and a planarization layer that are stacked between the first sub-electrode and the second sub-electrode; wherein an orthographic projection of the filter unit lies within an orthographic projection of the first electrode; the planarization layer is located on a side of the filter unit proximate to the second sub-electrode.

15. The method according to claim 14, wherein the pixel driving circuit further includes a first transistor, and the first transistor includes a first gate, a first semiconductor active pattern, and a first source and a first drain; the first transistor is a driving transistor;

forming the pixel driving circuit further includes:

synchronously forming a semiconductor pattern used for forming the second storage electrode in a process of forming the first semiconductor active pattern; and performing a conducting processing on the semiconductor pattern used for forming the second storage electrode to obtain the second storage electrode.

16. The method according to claim 15, wherein the display substrate further includes gate lines and data lines; the pixel driving circuit further includes a second transistor, and the second transistor includes a second gate, a second semiconductor active pattern, a second source and a second drain;

a portion of a gate line serves as the second gate; the second source is electrically connected to a data line, and the second drain is electrically connected to the first gate and the second storage electrode;

forming the pixel driving circuit further includes:

synchronously forming the second semiconductor active pattern in a process of forming the first semiconductor active pattern;

the method further comprises:

synchronously forming the gate lines in a process of forming the first gate; and synchronously forming the second source, the second drain, and the data lines in a process of forming the first source and the first drain.

17. The method according to claim 16, wherein the display substrate further includes power lines; the first source is electrically connected to a power line, and the first drain is electrically connected to the first electrode;

the display substrate further includes sensing signal lines; the pixel driving circuit further includes a third transistor; the third transistor includes a third gate, a third semiconductor active pattern, a third source and a third drain;

the third source is electrically connected to the first drain through a second connection electrode, and the third source, the second connection electrode and the first drain are of an integrated structure;

the third drain is electrically connected to a sensing signal line;

for third gates of third transistors in any row of sub-pixels, portions of the gate line connected to second transistors in an adjacent row of sub-pixels closest to the third transistors in the row of sub-pixels serve as the third gates of the third transistors;

forming the pixel driving circuit further includes:

synchronously forming the third semiconductor active pattern in a process of forming the first semiconductor active pattern;

the method further comprises:

synchronously forming the third source, the third drain, the power lines and the sensing signal lines in a process of forming the data lines.

18. The method according to claim 17, further comprising:

synchronously forming a first metal pattern and a second metal pattern in the sub-pixel on the base before the pixel driving circuit is formed, so that after the pixel driving circuit is formed, the first semiconductor active pattern is formed on a side of the first metal pattern away from the base, and the second connection electrode is formed on a side of the second metal pattern away from the base, wherein in a thickness direction of the base, an orthogonal projection of the first semiconductor active pattern on the base is within an orthogonal projection of the first metal pattern on the base, and an orthogonal projection of the second metal pattern on the base and an orthogonal projection of the second connection electrode on the base at least partially overlap; the first metal pattern and the second metal pattern in the sub-pixel are of an integrated structure, the second metal pattern is electrically connected to the second connection electrode through a fourth via hole; and the second metal pattern is electrically connected to the third source.

* * * * *